(12) United States Patent
Kobayashi

(10) Patent No.: US 7,598,809 B2
(45) Date of Patent: Oct. 6, 2009

(54) RF POWER AMPLIFIER

(75) Inventor: Bun Kobayashi, Cypress, CA (US)

(73) Assignee: Silicon Storage Technology, Inc., Sunnyvale, CA (US)

( * ) Notice: Subject to any disclaimer, the term of this patent is extended or adjusted under 35 U.S.C. 154(b) by 0 days.

(21) Appl. No.: 11/948,910

(22) Filed: Nov. 30, 2007

(65) Prior Publication Data

US 2009/0140814 A1    Jun. 4, 2009

(51) Int. Cl.
*H03F 3/68* (2006.01)
(52) U.S. Cl. .................... 330/295; 330/124 R
(58) Field of Classification Search ............... 330/295, 330/124 R, 285, 296, 84, 126
See application file for complete search history.

(56) References Cited

U.S. PATENT DOCUMENTS

| | | | |
|---|---|---|---|
| 5,321,279 A | 6/1994 | Khatibzadeb et al. | |
| 5,629,648 A | 5/1997 | Pratt | |
| 6,441,687 B1 * | 8/2002 | Apel | 330/296 |
| 6,448,859 B2 | 9/2002 | Morizuka et al. | |
| 6,784,747 B1 | 8/2004 | Zhang et al. | |
| 6,816,015 B2 * | 11/2004 | Zhang et al. | 330/295 |
| 6,828,861 B2 | 12/2004 | Cho et al. | |
| 7,098,740 B2 | 8/2006 | Kondo et al. | |
| 7,227,418 B2 * | 6/2007 | Makioka | 330/295 |
| 7,449,957 B2 * | 11/2008 | Enomoto et al. | 330/295 |

OTHER PUBLICATIONS

Liu, et al., "The Use Of Base Ballasting To Prevent The Collapse Of Current Gain In A1GaAs/GaAs Heterojunction Bipolar Transistors," IEEE Trans. Electron Devices, vol. 43, pp. 245-251, 1996.

Gao, et al., "Emitter Ballasting Resistor Design For, And Current Handling Capability Of A1GaAs/GaAs Power Heterojunction Bipolar Transistors," IEEE Trans. Electron Devices, vol. 38, pp. 185-196, 1991.

* cited by examiner

*Primary Examiner*—Henry K Choe
(74) *Attorney, Agent, or Firm*—DLA Piper LLP (US)

(57) ABSTRACT

An RF power amplifier includes a plurality of amplifier cells. Each amplifier cell includes a bipolar transistor and a base circuit that comprises an RF coupling capacitor, a bias resistor, a base capacitor, and a base resistor. The base circuit transmits DC bias current and an RF signal to the base of the bipolar transistor to provide a selectable frequency response. The base circuit may be implemented using a structure of stacked capacitors.

11 Claims, 4 Drawing Sheets

RF POWER AMPLIFIER

TECHNICAL FIELD

The present invention generally relates to a power amplifier, and more particularly to power amplifiers operating at radio frequency and microwave.

BACKGROUND

Some high power radio frequency (RF) amplifiers formed of bipolar transistors have problems with current collapse and sub-harmonics generation. The current collapse is caused by an asymmetrical circuit configuration and a non-uniform temperature distribution in the bipolar transistors. Current collapse is typically solved by a technique of dividing a large bipolar transistor into a plurality of amplifier cells with smaller bipolar transistors, and adding a plurality of resistors as ballasts to the bases and emitters of the smaller bipolar transistors in the amplifier cells. Although deep driving amplifiers at high power provides added efficiency, sub-harmonics are generated when bipolar transistors of the amplifiers are driven by a large RF signal. The sub-harmonic problem can not be disregarded because communication systems, such as global systems for mobile communication (GSM), typically have a sub-harmonic level lower than −35 dBm.

SUMMARY

An RF power amplifier comprises a plurality of amplifier cells. Each amplifier cell comprises a bipolar transistor and a base circuit. Each bipolar transistor includes an emitter coupled to a ground node. Each base circuit includes an RF input node for receiving an RF signal, includes a bias voltage node for receiving a bias voltage, and includes a base node coupled to the base of the bipolar transistor.

In one aspect, each base circuit comprises first and second capacitors and first and second resistors. The first capacitor is coupled between the RF input node and the first resistor. The first resistor is coupled between the bias voltage node and the first capacitor. The second capacitor and the second resistor are coupled together in parallel and coupled between the base of the bipolar transistor and a node formed by the first resistor and the first capacitor.

In one aspect, the collector of the bipolar transistor is coupled to a collector node.

In another aspect, the base circuit includes a first circuit to control sub-harmonics of the bipolar transistor and includes a second circuit to provide ballast to control current collapse of the bipolar transistor.

BRIEF DESCRIPTION OF THE DRAWINGS

The aspects and features of the present invention will become more apparent from the consideration of the following detailed description taken in conjunction with the accompanying drawings.

DETAILED DESCRIPTION

Figure 1:
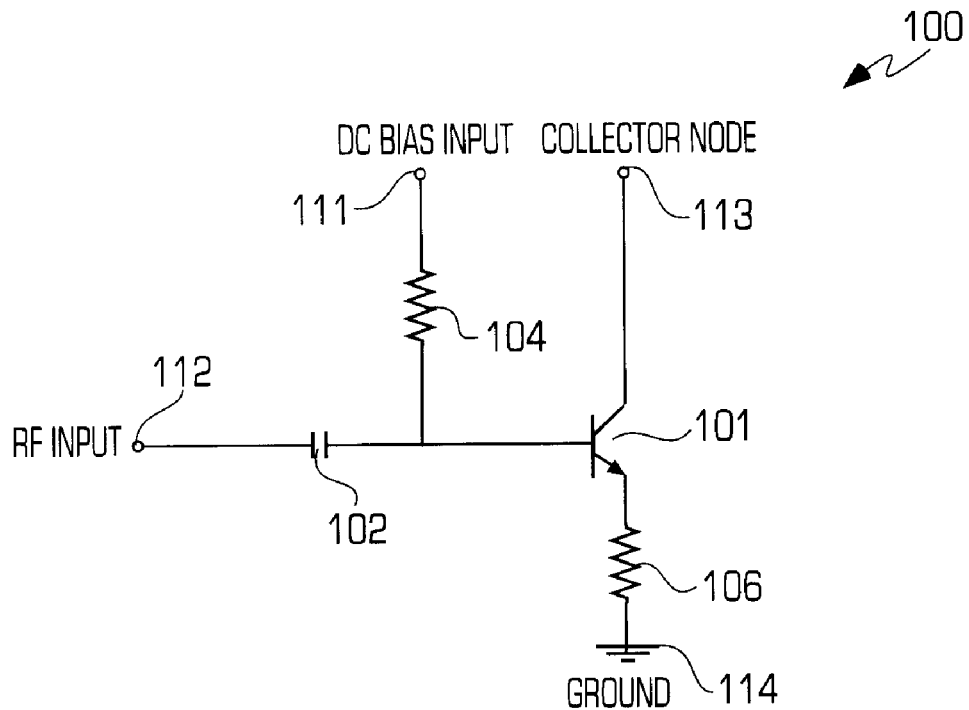
FIG. 1 is a schematic diagram of a conventional power amplifier including a ballast.

FIG. 1 is a schematic diagram of the conventional power amplifier cell 100, which may be one of a plurality of power amplifier cells in a power amplifier circuit. The power amplifier cell 100 comprises a bipolar transistor 101, a capacitor 102, a bias resistor 104 and an emitter resistor 106. The capacitor 102 couples an RF1 input node 112 to a base of the bipolar transistor 101. The bias resistor 104 couples a DC bias input node 111 to the base of the bipolar transistor 101. The emitter resistor 106 couples an emitter of the bipolar transistor 101 to a ground node 114. A collector of the bipolar transistor 101 is coupled to a collector node 113, which may be coupled to an output node (not shown). An RF signal is applied to the base of the bipolar transistor 101 through the RF input node 112 and the capacitor 102. The capacitor 102 couples the RF signal to the base of the bipolar transistor 101 by blocking the DC bias current flowing from the RF signal source. DC bias current is applied from the DC bias input node 111 to the base of the bipolar transistor 101 through the bias resistor 104. The resistors 104 and 106 are ballasts for reducing current collapse of the power amplifier cell 100 from high temperature operation.

The emitter resistor 106 is a ballast and equivalently appears in an output circuit of the bipolar transistor 101. A large emitter current flowing through the resistors 104 and 106 loses the RF power and DC current in the resistors 104 and 106. Also, the loss of DC current reduces the voltage applied from a DC power supply on the bipolar transistor 101, and limits the swing of output RF power. Therefore, the ballast of the emitter resistor 106 decreases the RF output power and power added efficiency (PAE) of the power amplifier cell 100. Moreover, the RF signal is directly coupled to the base of the bipolar transistor 101 via the coupling capacitor 102 to cause the bipolar transistor 101 to be deeply driven by the RF signal, although the emitter resistor 106 sometimes increases the RF stability of the power amplifier cell 100. The overdriving profile occasionally causes the bipolar transistor 101 of the power amplifiers to be unstable. The unstable power amplifiers output undesired spurious and sub-harmonics as noted above.

Figure 2:
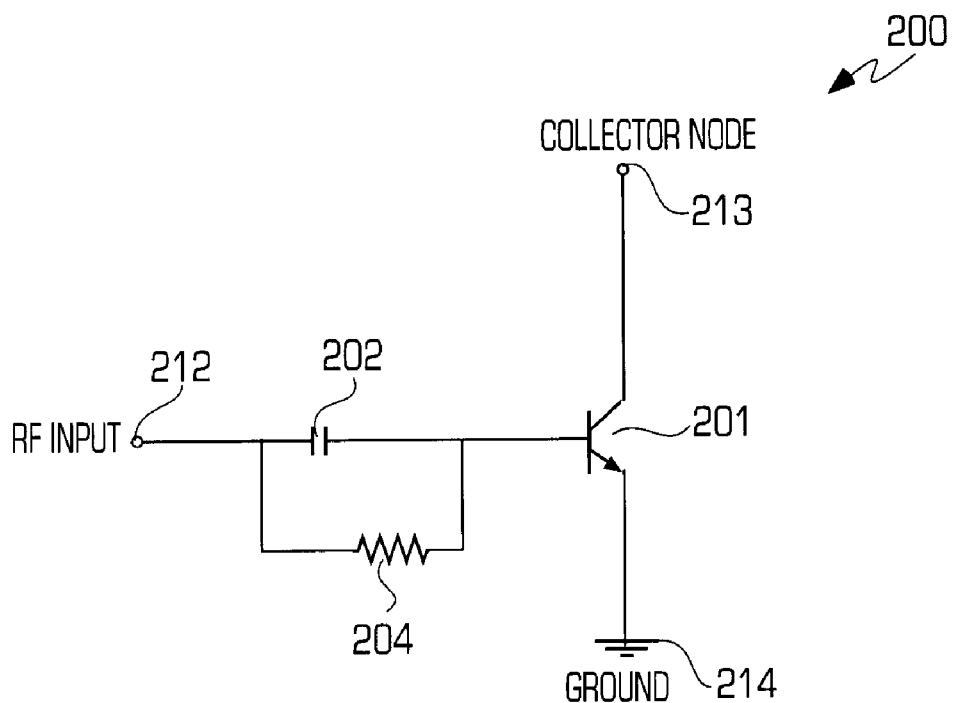
FIG. 2 is a schematic diagram of a conventional power amplifier including a base resistor and a capacitor.

FIG. 2 is a schematic diagram of a conventional power amplifier 200. The power amplifier 200 comprises a bipolar transistor 201, a capacitor 202, and a resistor 204. The capacitor 202 and the resistor 204 are coupled to each other in parallel and coupled between an RF input node 212 and a base of the bipolar transistor 201. The resistor 204 acts as a ballast, and also improves RF stability of the bipolar transistor 201, although the capacitor 202 functions as a bypass to the RF signal. However, the capacitor 202 does not block the DC bias current flowing from an RF signal source or from one bipolar transistor to another bipolar transistor in an power amplifier cell configuration. The resistor 204 acts as the ballast, and also has a function of improving RF stability. In addition, the ballast of current collapse uses a larger resistor value than that of RF stability.

Figure 3:
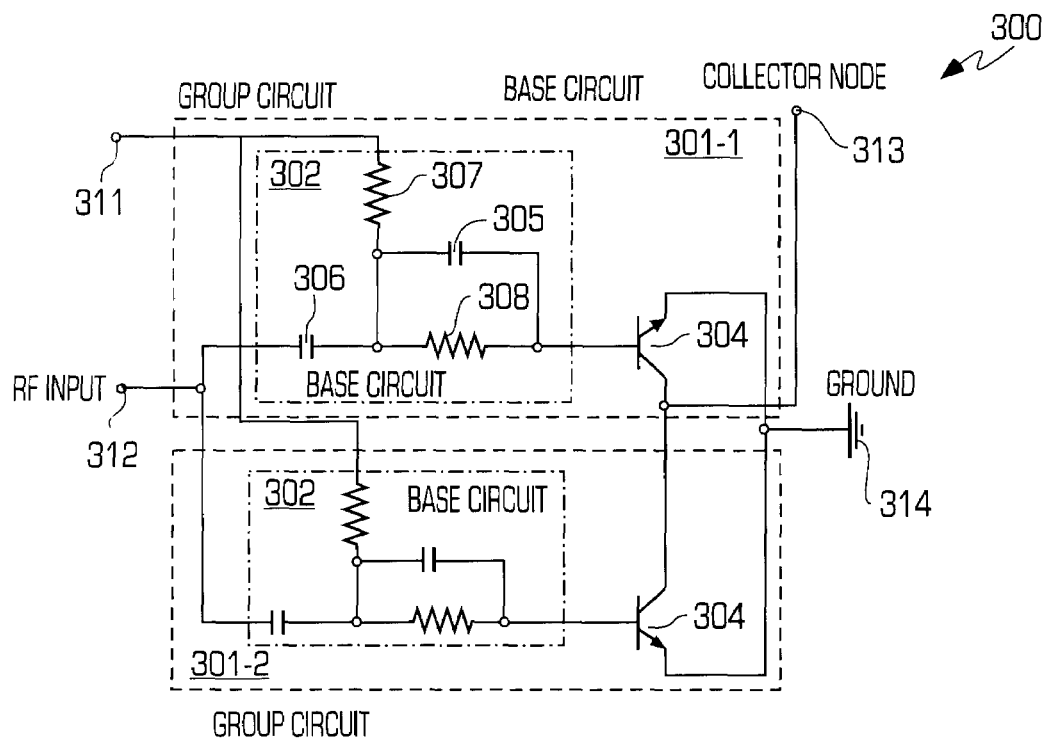
FIG. 3 is a schematic diagram illustrating a power amplifier cell in accordance with the present invention.

FIG. 3 is a schematic diagram illustrating a power amplifier cell 300 in accordance with the present invention. The power amplifier cell 300 comprises a plurality of amplifier group circuits 301-1 and 301-2. Although the power amplifier cell 300 comprises two amplifier group circuits 301 in an illustrative embodiment shown in FIG. 3, the power amplifier cell 300 may comprise other numbers of amplifier group circuits 301. In one embodiment, the amplifier group circuits 301 are identical. Each of the amplifier group circuits 301 comprises a base circuit 302 and a bipolar transistor 304. In one embodiment, the bipolar transistor 304 is a heterojunction bipolar transistor. The base circuit 302 comprises a base capacitor 305, an RF coupling capacitor 306, a bias resistor 307, and a base resistor 308. A first node of the bias resistor 307 is coupled to a DC bias input node 311. A second node of the bias resistor 307 is coupled to a node formed of nodes of the base resistor 308, the base capacitor 305, and the RF coupling capacitor 306. Another node of the base resistor 308 and another node of the base capacitor 305 are coupled together and to the base of the bipolar transistor 304. The base resistor 308 and the base capacitor 305 are coupled in parallel. A second node of the RF coupling capacitor 306 is coupled to an RF input node 312. A collector of the bipolar transistor 304 is coupled to a collector node 313, which may be coupled to an output node (not shown). An emitter of the bipolar transistor 304 is coupled to a ground node 314.

Figure 4:
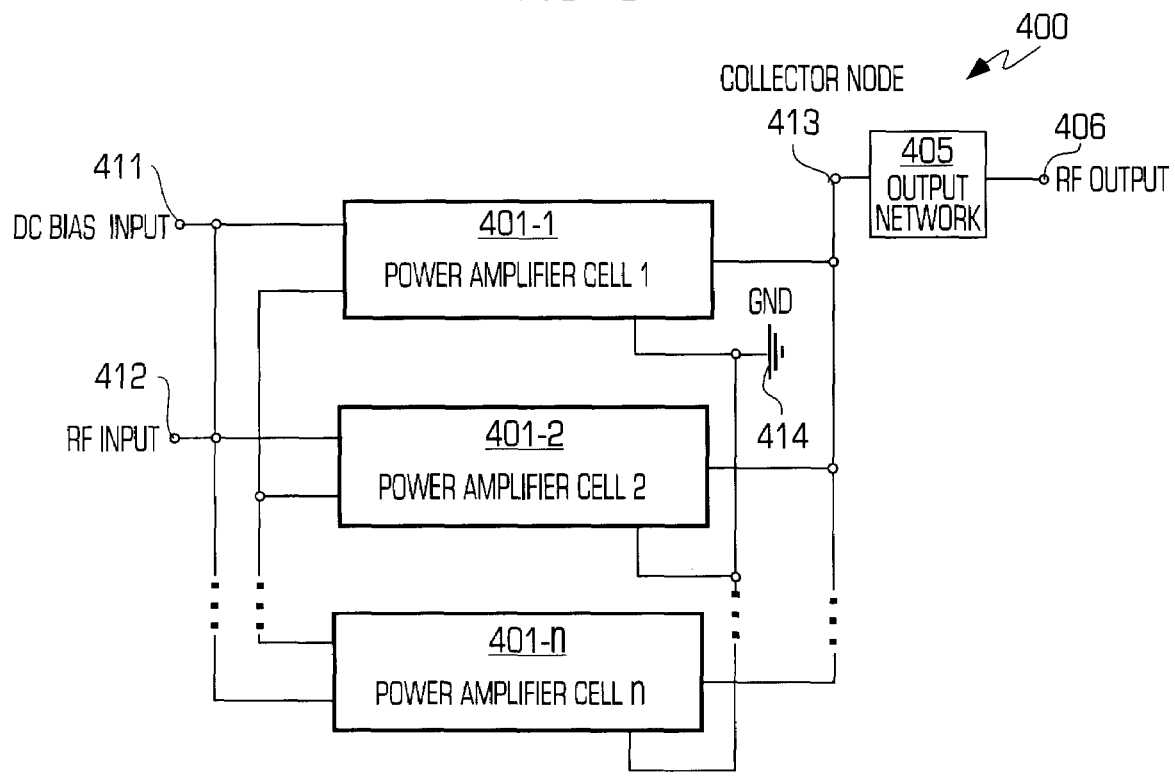
FIG. 4 is a block diagram illustrating a power amplifier system in accordance with the present invention.

FIG. 4 is a block diagram illustrating a power amplifier system 400 in accordance with the present invention. The power amplifier system 400 comprises a plurality of power amplifier cells 401-1 through 401-$n$, and an output network 405. A DC bias input node 411 is coupled to each of the power amplifier cells 401-1 through 401-$n$. An RF input node 412 is coupled to each of the power amplifier cells 401-1 through 401-$n$. The outputs of the power amplifier cells 401-1 through 401-$n$ are coupled to a collector node 413, which is coupled to an output network 405. An RF output network node 406 is coupled to the output network 405. A ground node 414 is coupled to the power amplifier cells 401-1 through 401-$n$. The power amplifier cells 401-1 through 401-$n$ may be identical. The overall number n of the power amplifier cells 401 may be either odd or even. The output network 405 may include an RF choke, output impedance converting components and a node for coupling to a DC power supply. An illustrative embodiment of the output network 405 is described below in conjunction with FIG. 7. The output network 405 is coupled between the collector node 413 and the output node 406. In an embodiment of the power amplifier cell 401 that includes a power amplifier cell 300, the RF input node 412 is coupled to the RF input node 312, and the DC bias input node 411 is coupled to the DC bias input node 311. Further, the ground node 414 is coupled to the ground node 304, and the collector node 413 is coupled to the collector node 313.

The power amplifier system 400 may be included in wireless communication systems, e.g., telephones of global system for mobile communication (GSM), wireless local area network (WLAN), worldwide interoperability for microwave access (WiMAX), or in optical communication systems.

Referring again to FIG. 3, the operation of the power amplifier cell 300 is described. A DC bias current applied to the DC bias input node 311 is provided to the base of the bipolar transistor 304 through the bias resistor 307 and the base resistor 308. The RF coupling capacitor 306 prevents DC current flowing into the bipolar transistor 304 from an RF signal source coupled to the RF input node 312. An RF signal applied to the RF input node 312 is applied to the base of the bipolar transistor 304 through the RF coupling capacitor 306, and the parallel circuit formed of the base resistor 308 and the base capacitor 305. In one embodiment, the capacitance of the RF coupling capacitor 306 is sufficiently large to reduce the loss of RF transmission, and the resistance of the bias resistor 307 is sufficiently large to reduce RF leakage. In an illustrative example of a power cell 300 operating in a GSM frequency band, the RF coupling capacitor 306 has a capacitance of 0.20 Pico Farads, and the bias resistor 307 has a resistance of 390 ohms. The RF coupling capacitor 306 and the bias resistor 307 affect the balance of the DC and RF driving, while the power amplifier 300 operates in a deep nonlinear state. Also, the bias resistor 307 offers a ballast for preventing current collapse of the integrated power amplifier cell 300.

The resistors 307 and 308 operate as base ballasts for controlling current for thermal issues. The RF coupling capacitor 306 operates for RF coupling. The parallel impedance of the base capacitor 305 and the base resistor 308 controls the magnitude of the inputted RF signal applied to the bipolar transistor 304. The base resistor 308 reduces sub-harmonics, because it prevents the power amplifier cell 300 from being overdriven. The base capacitor 305 provides selectable frequency response based on its higher impedance at lower frequency. Therefore, the base circuit 302 is used in the power amplifier cell 300 to embody the present invention transmitting RF signal without thermal collapse and eliminating sub-harmonics.

One feature of the power amplifier cell 300 may include high power efficiency. The base side of the bipolar transistor 304 has smaller current (or power) compared with the emitter side. The base capacitor 305 and the base resistor 308 are coupled to the base side of the bipolar transistor 304, and not the emitter side, so that the base capacitor 305 and the base resistor 308 cause smaller loss of RF signal and DC current. Another feature of the power amplifier cell 300 may be from the symmetry configuration of the power amplifier cell 300. The power amplifier cell 300 includes two bipolar transistors 304 arranged as two emitter fingers. The temperature distribution of the emitter fingers is rather uniform in comparison with that of unsymmetrical configuration such as three fingers. Further, the power cell of the finger pair allows either odd or even numbers of power cells to integrate a power amplifier. Another feature of the power amplifier cell may improve the linearity of the power amplifier in terms of limiting the magnitude of RF input. The base-emitter junction of the bipolar transistor 304 dominates the nonlinear feature to the power amplifier. The contributions of harmonics and distortions can be typically reduced several dBs.

Figure 5:
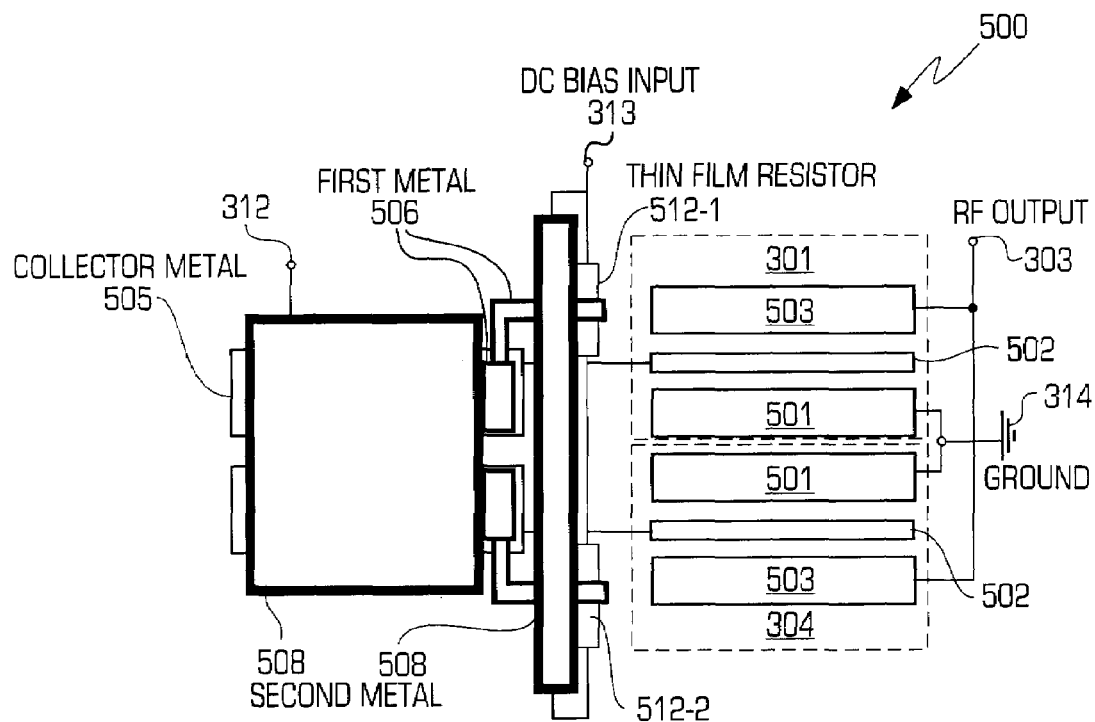
FIG. 5 is a top plan view illustrating a layout of a portion of a power amplifier cell of FIG. 3 in accordance with the present invention.
Figure 6:
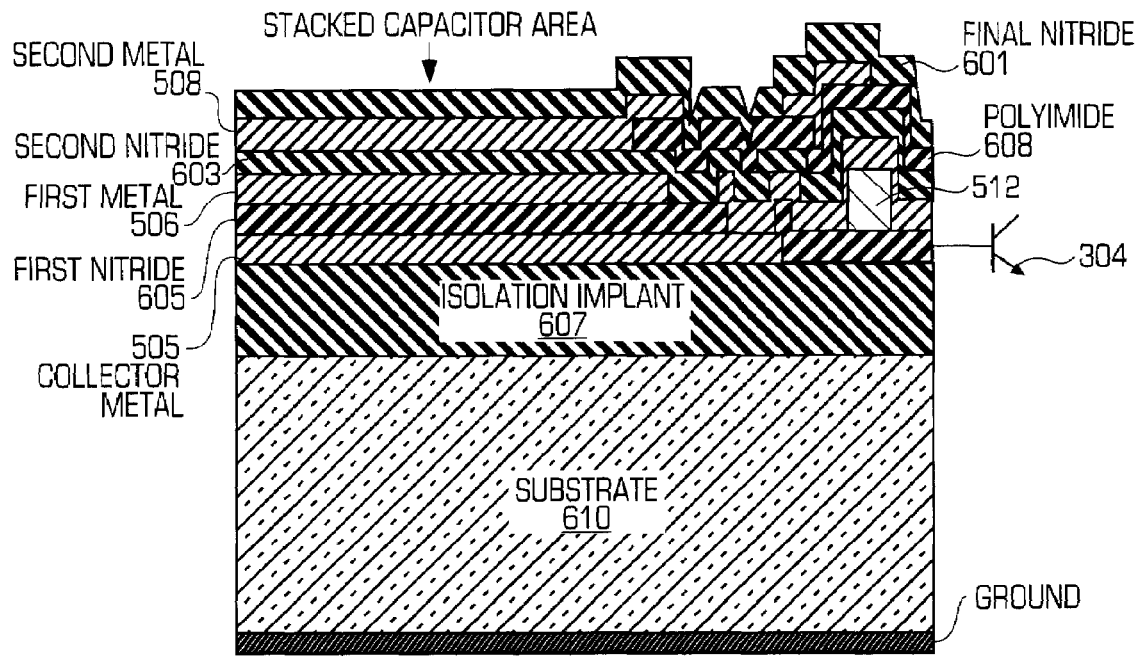
FIG. 6 is a partial cross-section view of the power amplifier cell of FIG. 5 in accordance with the present invention.

FIG. 5 is a top plan view illustrating a layout of the power amplifier cell 300. For the sake of clarity, insulating layers, such as nitrides and polyimide, and contact holes of metals are not shown in FIG. 5. FIG. 6 is a partial cross-section view of the power amplifier cell of FIG. 5. For the sake of clarity, the cross-sectional structure of the bipolar transistor 304 is not shown in FIG. 6. Instead the bipolar transistor 304 is shown by a schematic symbol.

The capacitors 305 and 306 are formed as a stacked structure, e.g., the RF input capacitor 306 is formed onto the base capacitor 305. Top and bottom planes of the RF input capacitor 306 are fabricated by a second metal 508 and a first metal 506, respectively. Top and bottom planes of the base capacitor 305 are formed of the first metal 506 and a collector metal 505, respectively. (The collector metal 505 is referred to as "collector metal" because this metal layer may be used to form the collector contact of the transistor. However, the collector metal 306 may be formed by a separate process from the capacitors and the collector.) The resistors 307 and 308 may be thin film resistors 512-1 and 512-2, respectively. A strip of the first metal 506 may be formed on the thin film resistor 512-1 dividing it to form the resistors 307 and 308. The first metal 506 is connected to a center plane of the stacked capacitor. The top plane of the stacked capacitors is fabricated by the second metal 508, which is connected to the RF input node 312. The bottom plane of the capacitors fabricated by the collector metal 505 is coupled to the base 502 of the bipolar transistor 304, and another node of the resistor 308. A strip formed by the second metal 508 is coupled to the DC bias input 313 of overall amplifier groups. An emitter node 501, a base node 502, and a collector node 503 of the bipolar transistor 304 may be formed with a rectangular shape and parallel to each other.

A substrate 610 may be formed of GaAs material. An isolation implant 607 is defined by ion implantation on the substrate 610. The collector metal 505 is formed on the isolation implant 607. A first nitride layer 605 is formed on the collector metal 505, after regions in the collector metal 505 are removed to form the plate of the base capacitor 305 and the collector contact. An insulating layer (not shown and, for example, formed of polyimide) is deposited to reduce crossover capacitance between a second nitride 603 and the second metal 508. In the stacked area, the insulating layer is specially removed for defining the area of stacked capacitors due to its thickness and low dielectric constant. The layer of collector metal 406 is utilized as a bottom plane, and coupled by the first metal 506 to a thin film resistor 512. A second nitride layer 603 is formed on the first metal layer 506. A final nitride layer 601 is formed of silicon nitride as a preservation layer on the second metal 508.

The stacked structure may be formed using conventional foundry techniques. In one embodiment, the nitride layers 603 and 605 of the capacitors 305 and 306 are insulated and may be formed of silicon nitride. In an illustrative example, the layers 603 and 605 are the same thickness of 0.16 um, and the stacked capacitance density is 0.72 fF/um2, which is double of the conventional capacitance of 0.36 fF/um2.

The power amplifier cell 300 may be implemented in an integrated circuit. Further, the power amplifier cell 300 may be implemented compactly because the capacitors 305 and 306 are formed in a stacked structure.

Figure 7:
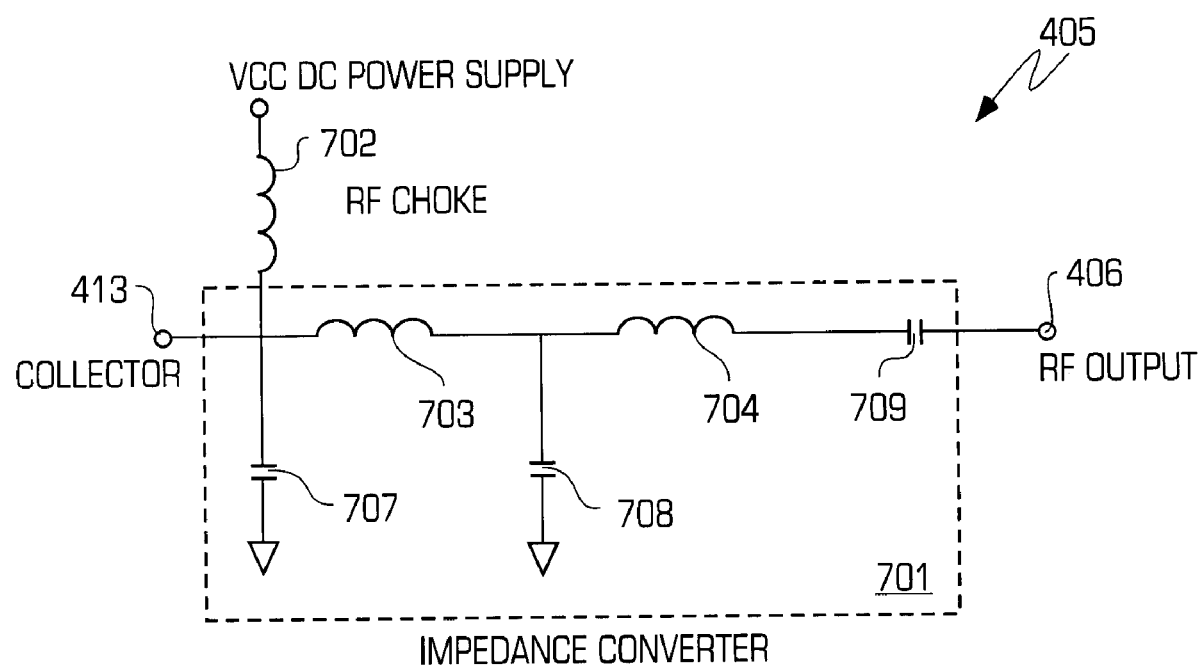
FIG. 7 is a schematic diagram illustrating an output network of the power amplifier cell of FIG. 4.

FIG. 7 is a schematic diagram illustrating the output network 405 (FIG. 4). The output network 405 comprises an impedance converter 701 coupled between the collector node 413 and the output node 406, and further comprises an inductor 702 coupled between the impedance converter 701 and the DC power supply. The impedance converter 701 comprises a plurality of inductors 703 and 704 and a plurality of capacitors 707, 708 and 709.

In the foregoing description, various methods and apparatus, and specific embodiments are described. However, it should be obvious to one conversant in the art, various alternatives, modifications, and changes may be possible without departing from the spirit and the scope of the invention which is defined by the metes and bounds of the appended claims.

What is claimed is:

1. An RF power amplifier comprising:
a plurality of amplifier cells, each amplifier cell comprising a bipolar transistor and a base circuit,
each bipolar transistor including a collector coupled to an output node, including a base, and including an emitter coupled to a ground node,
each base circuit including an RF input node for receiving an RF signal, including a bias voltage node for receiving a bias voltage, and including a base node coupled to the base of the bipolar transistor, each base circuit comprising a parallel resistor-capacitor circuit including a first node coupled to said bias voltage node and said RF input node, and including a second node coupled to said base node, and wherein the base circuit includes a first circuit to control sub-harmonics of the bipolar transistor and a second circuit to provide ballast to control current collapse of the bipolar transistor.

2. An RF power amplifier comprising:
a plurality of amplifier cells, each amplifier cell comprising a bipolar transistor and a base circuit;
each bipolar transistor including a collector coupled to an output node, including a base, and including an emitter coupled to a ground node;
each base circuit including an RF input node for receiving an RF signal, including a bias voltage node for receiving a bias voltage, and including a base node coupled to the base of the bipolar transistor;
wherein each base circuit comprises:
a first capacitor including a first node coupled to the RF input node and including a second node;
a first resistor including a first node coupled to the bias voltage node and including a second node coupled to the second node of the first capacitor;
a second capacitor including a first node coupled to the second node of the first capacitor and including a second node coupled to the base of the bipolar transistor; and
a second resistor including first and second nodes coupled to the respective first and second nodes of the second capacitor.

3. The RF power amplifier of claim 2 wherein the collectors of the bipolar transistors are coupled to a collector node.

4. The RF power amplifier of claim 2 wherein the first and second capacitors of the base circuits include a structure of stacked capacitors.

5. The RF power amplifier of claim 4 wherein one plate of the first or second capacitor is formed by a metal layer that is the same layer that forms a collector terminal of the bipolar transistor.

6. The RF power amplifier of claim 1 wherein at least two amplifier cells are arranged as a pair, the emitters of the transistors of the pair being configured as emitter fingers.

7. An RF power amplifier comprising:
a bipolar transistor including a collector coupled to an output node, including a base, and including an emitter coupled to a ground node, and
a base circuit including an RF input node for receiving an RF signal, including a bias voltage node for receiving a bias voltage, and including a base node coupled to the base of the bipolar transistor, the base circuit comprising a parallel resistor-capacitor circuit including a first node coupled to said bias voltage node and said RF input node, and including a second node coupled to said base node, and wherein the base circuit includes a first circuit coupled to the base of the bipolar transistor to control sub-harmonics of the bipolar transistor and includes a second circuit coupled to the base of the bipolar transistor to provide ballast to control current collapse of the bipolar transistor.

8. An RF power amplifier comprising:
a bipolar transistor including a collector coupled to an output node, including a base, and including an emitter coupled to a ground node; and
a base circuit including an RF input node for receiving an RF signal, including a bias voltage node for receiving a bias voltage, and including a base node coupled to the base of the bipolar transistor,
wherein the base circuit comprises:
a first capacitor including a first node coupled to the RF input node and including a second node;

a first resistor including a first node coupled to the bias voltage node and including a second node coupled to the second node of the first capacitor;

a second capacitor including a first node coupled to the second node of the first capacitor and including a second node coupled to the base of the bipolar transistor; and a second resistor including first and second nodes coupled to the respective first and second nodes of the second capacitor.

9. The RF power amplifier of claim 2, wherein at least two amplifier cells are arranged as a pair, the emitters of the transistors of the pair being configured as emitter fingers.

10. The RF power amplifier of claim 1, wherein each base circuit comprises:

a first capacitor including a first node coupled to the RF input node and including a second node coupled to the first node of the parallel resistor-capacitor circuit; and a first resistor including a first node coupled to the bias voltage node and including a second node coupled to the first node of the parallel resistor-capacitor circuit;

wherein the parallel resistor-capacitor circuit comprises:

a second capacitor including first and second nodes coupled to the respective first and second nodes of the parallel resistor-capacitor circuit; and a second resistor including first and second nodes coupled to the respective first and second nodes of the second capacitor.

11. The RF power amplifier of claim 7, wherein the base circuit comprises:

a first capacitor including a first node coupled to the RF input node and including a second node coupled to the first node of the parallel resistor-capacitor circuit; and a first resistor including a first node coupled to the bias voltage node and including a second node coupled to the first node of the parallel resistor-capacitor circuit;

wherein the parallel resistor-capacitor circuit comprises:

a second capacitor including first and second nodes coupled to the respective first and second nodes of the parallel resistor-capacitor circuit; and a second resistor including first and second nodes coupled to the respective first and second nodes of the second capacitor.

\* \* \* \* \*